(12) United States Patent
Miranda et al.

(10) Patent No.: US 7,983,181 B1
(45) Date of Patent: Jul. 19, 2011

(54) TECHNIQUE FOR NEGOTIATING A WIDTH OF A PACKET-BASED COMMUNICATION LINK

(75) Inventors: Paul Miranda, Austin, TX (US); Larry D. Hewitt, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 1186 days.

(21) Appl. No.: 11/379,866

(22) Filed: Apr. 24, 2006

Related U.S. Application Data

(60) Provisional application No. 60/786,546, filed on Mar. 28, 2006.

(51) Int. Cl.
  *H04L 12/26* (2006.01)
(52) U.S. Cl. .................... 370/252; 370/366
(58) Field of Classification Search ............ 370/252, 370/253, 366, 464, 537, 535, 476; 710/305–307
  See application file for complete search history.

(56) References Cited

U.S. PATENT DOCUMENTS

| | | | |
|---|---|---|---|
| 6,202,116 B1 | 3/2001 | Hewitt | |
| 6,223,237 B1 * | 4/2001 | McDermid | ............... 710/307 |
| 6,611,891 B1 | 8/2003 | Hewitt et al. | |
| 7,136,953 B1 * | 11/2006 | Bisson et al. | ............... 710/307 |
| 7,426,597 B1 * | 9/2008 | Tsu et al. | ............... 710/307 |
| 7,444,452 B2 * | 10/2008 | Chen et al. | ............... 710/307 |
| 7,469,311 B1 * | 12/2008 | Tsu et al. | ............... 710/307 |
| 7,694,060 B2 * | 4/2010 | McCall et al. | ............... 710/307 |
| 2002/0103945 A1 * | 8/2002 | Owen et al. | ............... 710/10 |
| 2005/0262284 A1 * | 11/2005 | Cherukuri et al. | ............... 710/307 |

OTHER PUBLICATIONS

"HyperTransport(TM) I/O Link Specification, Revision 2.00b," Document #HTC20031217-0036-0009, HyperTransport Technology Consortium, Apr. 27, 2005, 325 pages.

* cited by examiner

*Primary Examiner* — Ricky Ngo
*Assistant Examiner* — Gary Mui
(74) *Attorney, Agent, or Firm* — Zagorin O'Brien Graham LLP

(57) ABSTRACT

A technique for negotiating the width of a link between a first device and a second device includes detecting, during initialization, a respective signal on one or more control lines associated with at least a portion of an N-bit link. The N-bit link is configured as a single link having a width of N or multiple sublinks having a width less than N based on a respective value of the respective signal on the one or more control lines.

12 Claims, 4 Drawing Sheets

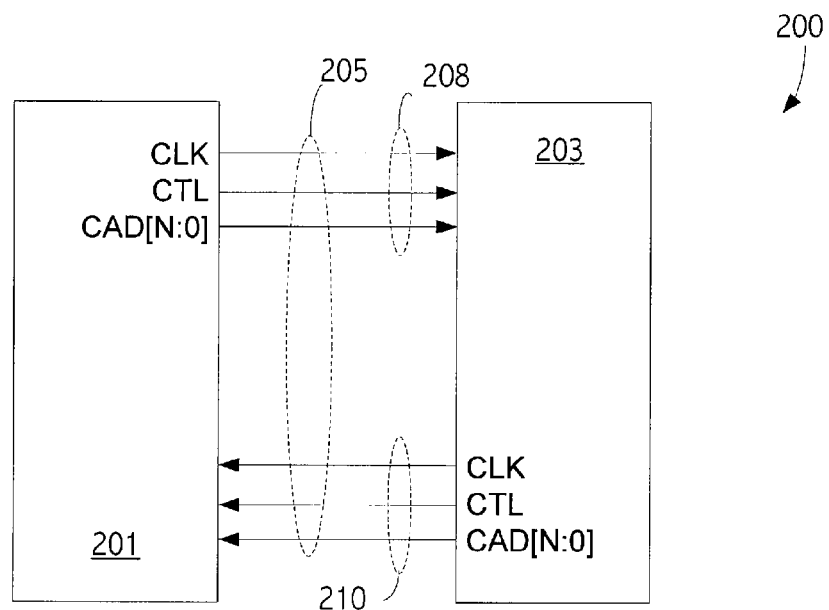
FIG. 2
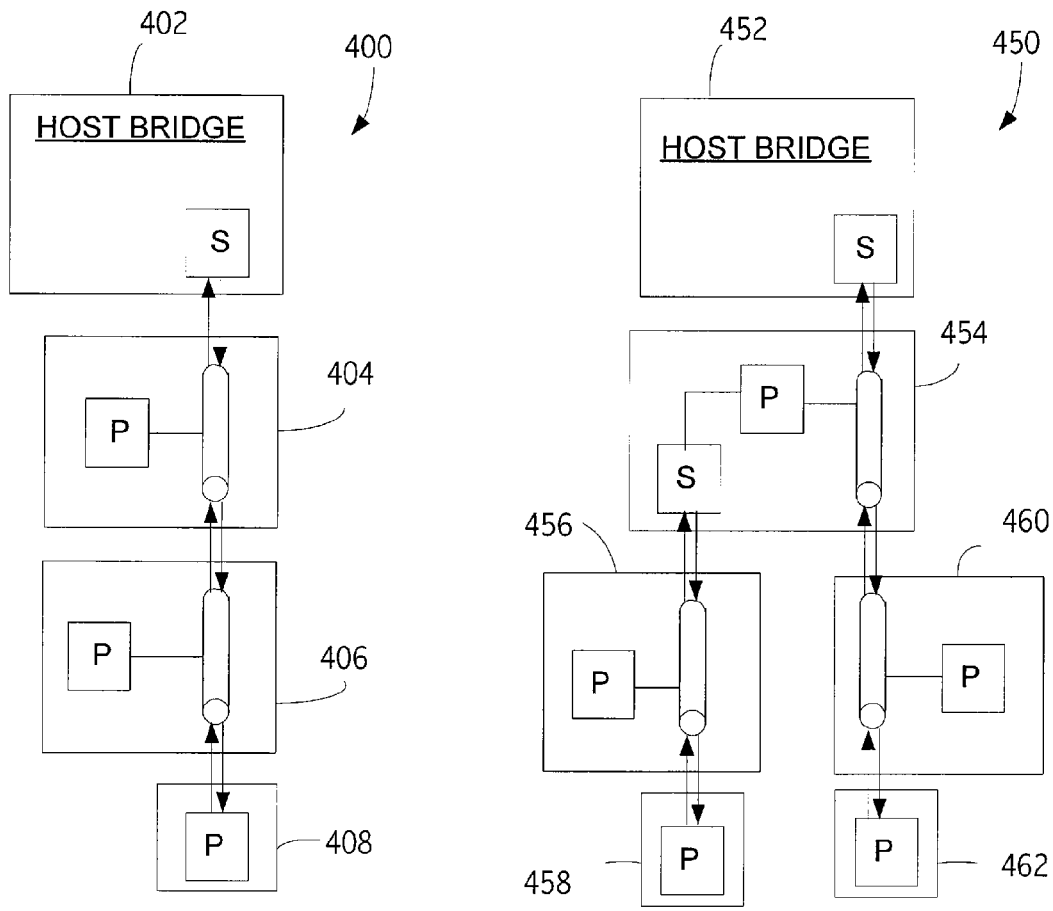
FIG. 4A
FIG. 4B

TECHNIQUE FOR NEGOTIATING A WIDTH OF A PACKET-BASED COMMUNICATION LINK

CROSS-REFERENCE TO RELATED APPLICATION(S)

This application claims the benefit of U.S. Provisional Application Ser. No. 60/786,546, filed Mar. 28, 2006, entitled "METHOD AND APPARATUS FOR LINK OPERATIONS," naming Gerry R. Talbot, Paul Miranda, Mark D. Hummel, William A. Hughes and Larry D. Hewitt as inventors, which application is incorporated herein by reference in its entirety for all purposes.

BACKGROUND

1. Field of the Invention

The present invention is generally directed to packet-based communication links and, more particularly, to an input/output communication link that uses one or more control signals to negotiate a width of the communication link.

2. Description of the Related Art

FIG. 1 depicts a traditional personal computer (PC) architecture 100 that partitions a computer system into various blocks. One feature of this prior art architecture is the use of the peripheral component interconnect (PCI) bus 101 as the connection between a "north bridge" integrated circuit 103 and a "south bridge" integrated circuit 105. The north bridge 103 functions generally as a switch connecting one or more central processing units (CPUs) 107, a graphics bus 109 (such as the accelerated graphics port (AGP) bus), the PCI bus 101 and main memory 111. The north bridge 103 also contains the memory controller function. The architecture also includes the "host bus" connection 108 between the north bridge 103 and the CPU 107.

The south bridge 105 provides an interface to various input/output (I/O) portions of the computer system 100 by providing a bridge function between the PCI bus 101 and legacy industry standard architecture (ISA) bus 115, an integrated device electronics (IDE) disk interface 117 and a universal serial bus (USB) 119. Other devices, buses and functions may also be included in the south bridge 105. In the illustrated prior art architecture, the PCI bus 101 also functions as a major I/O bus for add-in functions, such as network connection 121. The various buses and devices shown in FIG. 1 are conventional in the personal computer (PC) industry and are not described further herein.

Demand for increased system performance and the continuing increase in processor speeds has put pressure on system buses, such as the PCI bus and the host bus, to also provide better performance. However, configuration of some of the present buses, such as the multi-drop configuration of the PCI bus, tends to limit their performance. In an attempt to increase the performance of I/O buses, designers have designed various new bus architectures. For example, in the PCI Express (PCIe) architecture, a point-to-point topology was introduced. In this topology a shared switch replaces the shared bus of the PCI architecture. As such, in the PCIe architecture, each device has its own dedicated bus or link, which is composed of one or more lanes with each lane (i.e., a pair of send and receive signals) being capable of transmitting one bit at a time in both directions at the same time. At startup, PCIe devices negotiate with the switch to determine the maximum number of lanes for the link. The link width negotiation depends upon a maximum width of the link (i.e., an actual number of physical signal pairs), a width of an associated connector into which the device is plugged, a width of the device and a width of the switch interface. While the PCIe architecture allows for negotiating a maximum number of lanes for a link and splitting a link to facilitate different topologies, the PCIe architecture implements a relatively complex method for splitting a link that requires every lane to exchange identifying information serially at link initialization.

What is needed is a technique that allows connected devices to negotiate a width of an associated link that is relatively straightforward, easy to implement and readily allows for splitting a link to facilitate different topologies.

SUMMARY

According to one aspect of the present invention, a technique for negotiating the width of a link between a first device and a second device includes detecting, during initialization, a respective signal on one or more control lines associated with at least a portion of an N-bit link. The N-bit link is configured as a single link having a width of N or as multiple sublinks having a width less than N based on a respective value of the respective signal on the one or more control lines.

According to another aspect of the present invention, N is equal to sixteen. According to this aspect, the multiple sublinks may include two eight-bit sublinks. According to another embodiment, N is equal to thirty-two. According to this aspect, the multiple sublinks may include four eight-bit sublinks, one sixteen-bit sublink and two eight-bit sublinks, or two sixteen-bit sublinks. In general, the N-bit link includes a single unidirectional connection from the first device to the second device and from the second device to the first device for each respective bit of the N-bit link.

BRIEF DESCRIPTION OF THE DRAWINGS

The present invention may be better understood, and its numerous objects, features, and advantages made apparent to those skilled in the art by referencing the accompanying drawings.

FIG. 2 is an electrical block diagram of an exemplary system having two nodes connected by an input/output (I/O) link, configured according to one embodiment of the present invention.

FIG. 4A is an electrical block diagram of an exemplary I/O link chain.

FIG. 4B is an electrical block diagram of an exemplary I/O link tree.

The use of the same reference symbols in different drawings indicates similar or identical items.

DESCRIPTION OF THE PREFERRED EMBODIMENT(S)

Figure 1:
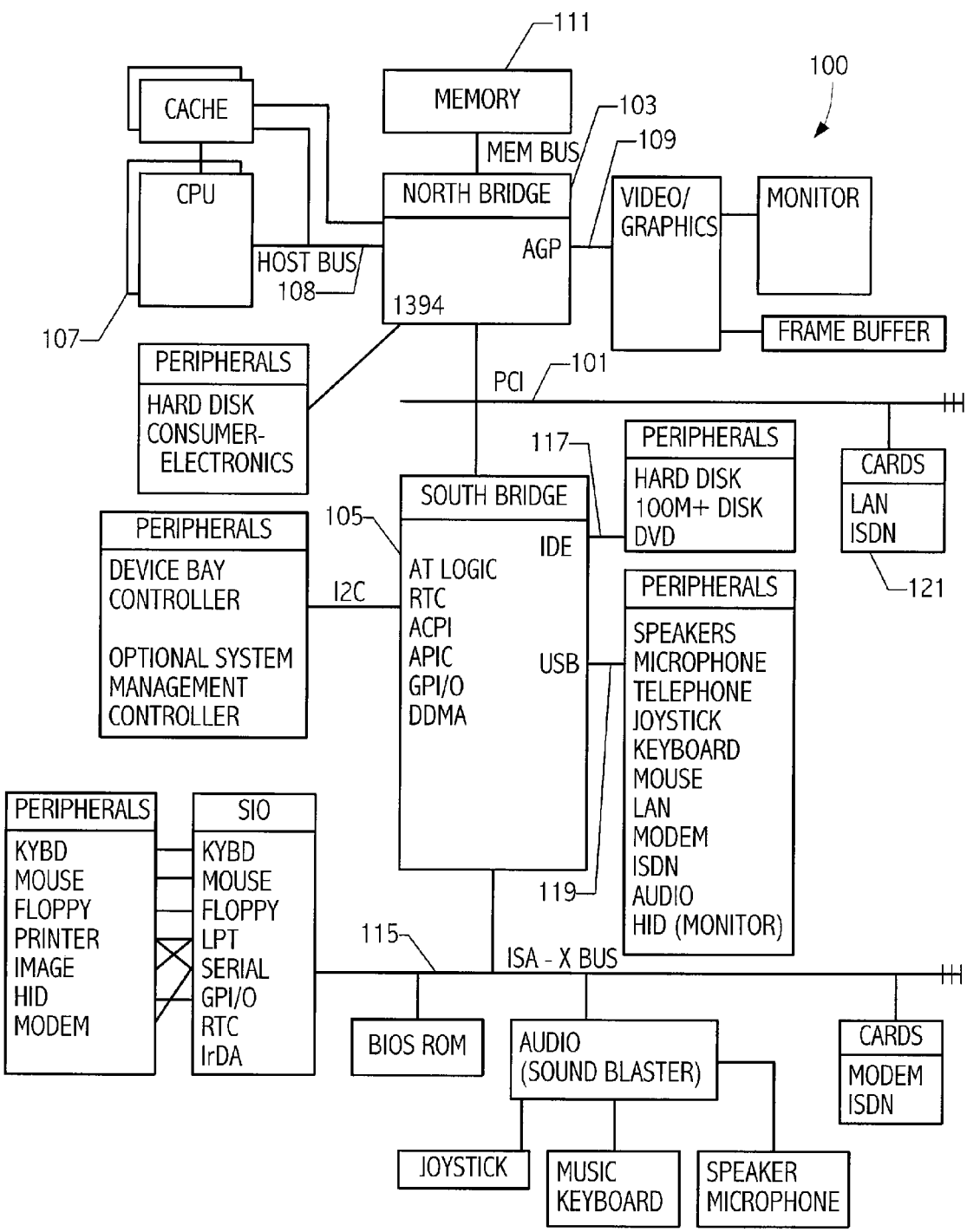
FIG. 1 is an electrical block diagram of a prior art computer system.

According to various aspects of the present invention, communication links of various widths may be provided by ganging or unganging sublinks of a communication link, based upon signals driven on one or more control lines of the link.

For example, links wider than eight bits may be provided by ganging multiple 8-bit sublinks in parallel to form, for example, either 16-bit or 32-bit links. As another example, a 16-bit link may be unganged into two 8-bit sublinks. As a further example, a 32-bit link may be unganged into four 8-bit sublinks, two 16-bit sublinks or two 8-bit sublinks and one 16-bit sublink. According to one aspect of the present invention, the determination of how a link is configured is determined during initialization. It should be appreciated that the techniques of the present invention may be generally applicable to links having less than eight bits or greater than thirty-two bits. With reference to FIG. 2, an exemplary system 200, configured according to one embodiment of the present invention, includes an input/output (I/O) link 205 and nodes (or devices) 201 and 203. The link 205 connects node 201 and node 203 via two unidirectional sets of conductors 208 and 210. As used herein a node is a physical entity that connects to one end of a link. The unidirectional conductors 208 and 210 each include an application appropriate number of clock (CLK), control (CTL) and command, address and data (CAD) lines, as is discussed in further detail below.

Figure 3:
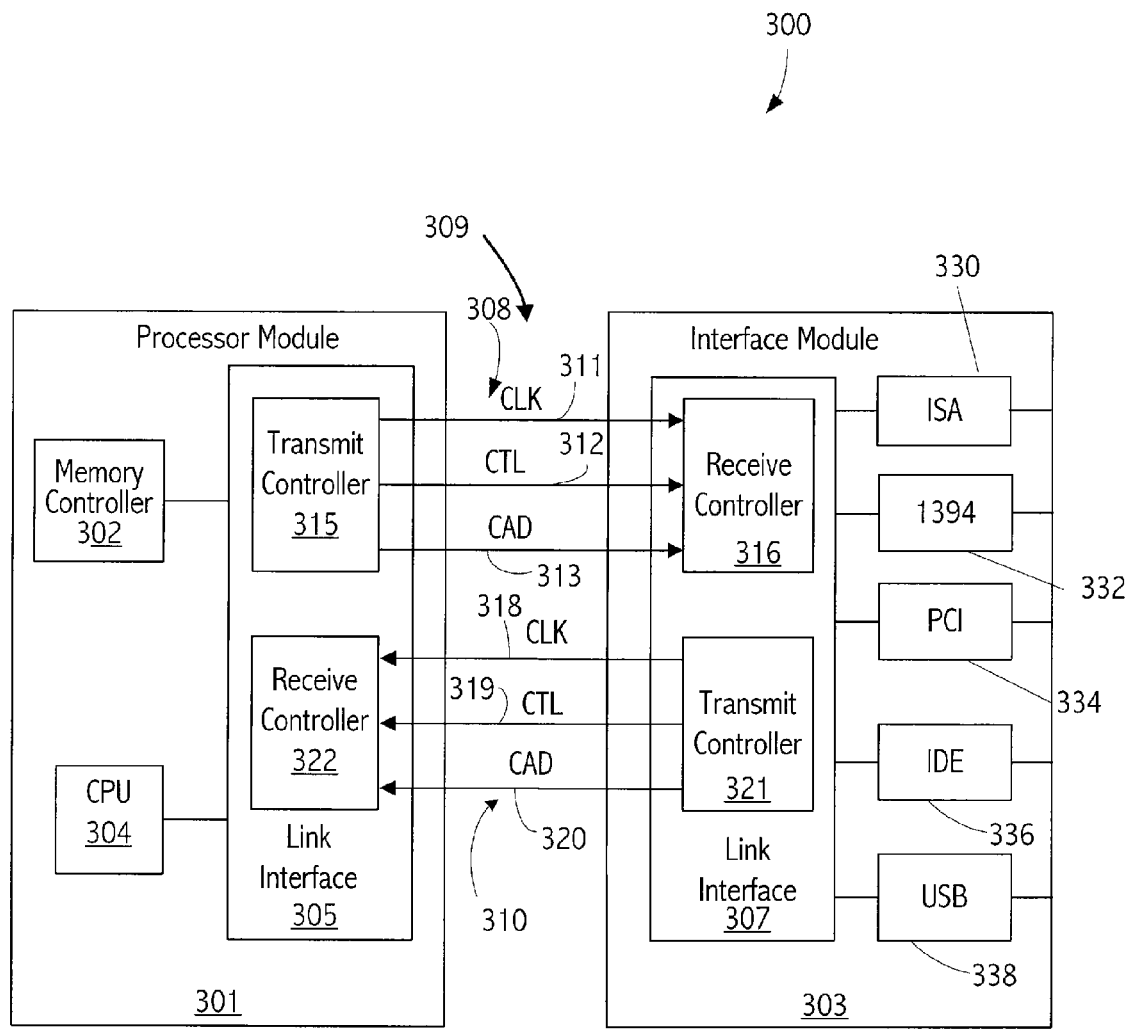
FIG. 3 is an electrical block diagram of an exemplary computer system having two nodes connected an I/O link, configured according to another embodiment of the present invention.

Referring to FIG. 3, a portion of an exemplary computer system 300 is shown which implements a high-speed interconnect or link, according to one embodiment of the present invention. As is shown, the computer system 300 includes node 301 and node 303. The node 301 includes a link interface 305 which is coupled to link interface 307 (in node 303), via a high-speed packet-based link 309. The link 309 connects the nodes 301 and 303 via two unidirectional sets of wires 308 and 310, The wires 308 include at least one unidirectional clock (CLK) line 311, at least one unidirectional control (CTL) line 312 and one or more unidirectional command, address and data (CAD) lines 313 connecting transmit controller 315 (in node 301) to receive controller 316 (in node 303). Similarly, the wires 310 include at least one unidirectional clock (CLK) line 318, at least one control (CTL) line 319 and one or more unidirectional command, address and data (CAD) lines 320 connecting transmit controller 321 (in node 303) to receive controller 322 (in node 301). The CAD lines 313 and 320 transmit command, address and data information between nodes 301 and 303. The transmit and receive controllers provide the control logic for link operations.

Each of the CAD lines 313 and 320 may include $2^N$ data bits, where N is greater than or equal to zero. Thus, a minimum implementation has one data bit in each direction. However, each unidirectional connection is typically in byte multiples of 8, 16, 32 bits or larger and is fixed in size. Note however, that the link does not have to be symmetrical. In other words, data lines 313 may be one byte wide, while data lines 320 may be four bytes wide. According to at least one embodiment, each unidirectional connection 308 and 310 includes one CLK and CTL line for each eight CAD lines on that unidirectional portion.

In an exemplary embodiment, the node 301 is a processor module that provides the major processing function in a computer system and includes a memory controller 302 and one or more central processing units (CPUs) 304. The processor module 301 may include one or more integrated circuits. In addition, the processor module 301 may include system memory (not shown) coupled to the memory controller 302. The node 303, in the exemplary embodiment shown in FIG. 3, is an interface module that provides an interface between various input/output (I/O) devices, such as hard drives, scanners, printers, network connections, modems etc., and the processor module 301. The exemplary interface module 303 includes industry standard architecture (ISA) interface 330 (providing an interface to an ISA bus), IEEE 1394 interface 332, peripheral component interconnect (PCI) bridge 334, intelligent drive electronics (IDE) controller 336 and universal serial bus (USB) interface 338. The interface module 303 may be a single integrated circuit. Other types of buses and I/O devices may also be present on interface module 303 in place of or in addition to those described.

In the illustrated embodiment, the interconnect 309 is a point-to-point link physically connecting precisely two integrated circuits. In that way, transfer speed across the link may be maximized. As used herein a "bit time" is one-half a clock (CLK) period in duration. That is, two data bits are transmitted on each wire per cycle on the link. For example, for a clock (CLK) rate of 400 MHz, data is provided on each edge of the clock which results in 800 million bit times per second.

The link 309 transfers packet-based information to and from a unit or function, which is a logical entity within a node, such as the memory controller 302, that acts as a source or a destination for transactions. A transaction is a sequence of packets exchanged between two or more nodes in the system which results in a transfer of information. A source is the node that starts a transaction. A target is the node that ultimately services the transaction on behalf of the source. There may be intermediary nodes between the source and the destination. That is, the link may be configured as a daisy chain. In addition to the CAD, CTL and CLK signals, in at least one embodiment, each device in the link receives a PWROK signal (not shown in FIG. 3) indicating that power is stable and clocks have been running for a predetermined amount of time. In this embodiment, each device on the link also receives a reset signal (RESET#, also not shown in FIG. 3).

The packet structure described herein is described with relation to 8-bit wide CAD lines. The packet structure for wider links, e.g., 16-bit and 32-bit links, can be derived from the 8-bit link packet structure by combining the fields within adjacent bit times. For example, $BT1_{16}[15:0]=BT2_8[7:0]$ & $BT1_8[7:0]$ $BT1_{32}[31:0]=BT4_8[7:0]$ & $BT3_8[7:0]$ & $BT2_8[7:0]$ & $BT1_8[7:0]$ where $BTN_m$ represents the Nth bit time within a packet for a link of width m and "&" represents concatenation. Thus, its takes two bit times to transfer the same information on an 8-bit link as can be transferred on a 16-bit link. Note that if all packets are multiples of 4 bytes long, packet boundaries will always fall on bit-time boundaries in the 16-bit and 32-bit case, as well as the 8-bit case and, thus, CTL may only be asserted on 4-byte boundaries in certain implementations.

The link 309 transmits control packets and data packets. The CTL signals 312 or 319 distinguish between the two types of packets. Control packets provide control information. For example, the control information may indicate the kind of command (read or write) or an address to which the command is directed. Data packets carry data related to corresponding read or write operations. In order to reduce latency for information in control packets and to provide flexibility, the CTL signal may allow control packets to be inserted in the middle of data packets. This is particularly advantageous when data packets are long. However, due to latency considerations in certain applications, it may be undesirable to put a write packet in a read response. In addition, in other embodiments, the control signal can also be used to insert delays in the middle of control packets.

The link in the embodiment described herein is assumed to be a pipelined split transaction link in which transactions are tagged by the source and responses can return out-of-order. Write command and read response packets always have an associated data packet. The data packet associated with the write command is the write data. The data packet associated with the read response is the requested read data for a previously sent read command.

I/O fabrics may be implemented as one or more daisy chains of devices with a host bridge at one end of the chain. In general, devices may implement either one or two links. A dual-link device, that is not a bridge, is referred to herein as a tunnel. A single-link device sits on the end of a chain. In general, all packets travel between one device and the host bridge. Thus, at a high level, the fabric appears as a group of devices directly connected to a host bridge, but not to each other. A tree contains one or more bridge devices each having a primary link (P) and one or more secondary links (S). A bridge device functions as a host bridge for devices on its secondary chain. A root of the tree connects to a host, which may contain multiple bridges, each supporting a single I/O chain or a tree of I/O chains. With reference to FIG. 4A, an exemplary chain topology 400, which includes a host bridge 402 that is coupled to a tunnel device 404, is depicted. The tunnel device 404 is coupled to another tunnel device 406, which is coupled to a single link device 408. With reference to FIG. 4B, an exemplary tree topology 450 is depicted. In the topology 450, a host bridge 452 is coupled to a bridge with a tunnel device 454, which is coupled to a tunnel device 456 and a tunnel device 460. The tunnel device 456 is coupled to a single-link device 458 and the tunnel device 460 is coupled to a single-link device 462.

As used herein the term "cold reset" refers to resetting node logic, links and configuration space registers (CSRs) of an input/output (I/O) link, e.g., initialization. As noted above, the term "node" is used to refer to a physical entity that connects to one end of a link. A unit or function, i.e., a logical entity, within a node, may act as a source or destination of a transaction. As is also noted above, the term "link" is used to refer to a pair of unidirectional connections between two nodes. A full link requires a connection in each direction. As noted above, connections are not required to have the same width in each direction. In a typical implementation, a link supports: 2, 4, 8, 16, or 32 command, address and data (CAD) signals; 1, 2, or 4 control (CTL) signals; and 1, 2, or 4 clock (CLK) signals. In at least one embodiment, links wider than eight bits may be built by ganging multiple 8-bit links in parallel to form, for example, either 16-bit or 32-bit links. As noted above, 16-bit links may be unganged to provide two 8-bit links. Similarly, 32-bit links may be unganged to provide four 8-bit links, two 8-bit links and one 16-bit link or two 16-bit links. As is noted above, CAD lines carry requests, responses, addresses and data.

In at least one embodiment, links wider than 8 bits have one CLK line and one CTL line per byte (i.e., per 8 bits). For example, a symmetrical 8-bit link carries one CLK signal (e.g., CLK[0]), one CTL signal (e.g., CTL[0]) and eight CAD signals (e.g., CAD[7:0]) in each direction. As another example, a symmetrical 16-bit link carries two CLK signals (e.g., CLK[1:0]), two CTL signals (e.g., CTL[1:0]) and sixteen CAD signals (e.g., CAD[15:0]) in each direction. In this example, CLK[0] and CTL[0] are associated with CAD [7:0] and CLK[1] and CTL[1] are associated with CAD [15:8]. As yet another example, a symmetrical 32-bit link carries four CLK signals (CLK[3:0]), four CTL signals (CTL[3:0]) and thirty-two CAD signals (CAD[32:0]) in each direction.

According to one embodiment of the present invention, a cold reset is facilitated by deasserting the PWROK signal together with assertion of the RESET# signal. It should be appreciated that a cold reset may be achieved by other techniques providing that node logic, links and CSRs are reset. According to one aspect of the present invention, after a cold reset, each device attempts to determine if its links are connected. Link detection is desirable to ensure that training patterns are not driven into an unpowered device. Training patterns may be chosen to provide a DC-balanced data pattern, sufficient transition density for rapid recovery centering and sufficient Hamming distance from each other. According to one aspect of the present invention, devices with one or more 16-bit links may optionally configure the 16-bit links as two unganged 8-bit sublinks. According to at least one embodiment, devices with 16-bit links indicate if they support unganging by a value driven on a CTL[1] lane of the link. For example, if a logical zero is driven on a CTL[1] lane of a 16-bit link two 8-bit links are indicated, assuming a receiver supports unganging. On the other hand, if a logical one is driven on a CTL[1] lane of a 16-bit link, a single 16-bit link is indicated.

According to another embodiment, 32-bit devices indicate if they support unganging by values driven on CTL[3:1] lanes of the link. For example, if CTL[3:1] are driven to a logical one a 32-bit link is indicated. As another example, if CTL[1] and CTL[3] are driven to a logical one and CTL[2] is driven to a logical zero, two 16-bit links are indicated, assuming an associated receiver supports unganging. As another example, if CTL[1] is driven to a logical one and CTL[2:3] are driven to a logical zero, one 16-bit link and two eight bit links are indicated, assuming an associated receiver supports unganging. It should be appreciated that the technique disclosed herein is generally applicable to links of any size where it may be desirable to configure a link as a single link or multiple sublinks.

If both sides of a link support unganging, multiple sublinks may be detected and trained separately. A receiver may determine whether it is capable of unganging by examining, for example, an input that is hardwired to a particular logic level. It should be appreciated that software may be required to enumerate the sublinks correctly. When unganging is not supported by one or more of the devices associated with a link, sublinks are ganged as a single link. According to various embodiments, devices that support unganging may implement an enumeration scratchpad register, which provides a scratchpad for enumeration software.

As noted above, after a cold reset each link attempts to determine if it is connected. In an exemplary 16-bit implementation, a transmitter of a device drives a logical one on CAD[15:0] and a logical zero on CTL[0] and CLK after PWROK is asserted, following a cold reset. If the transmitter supports unganging, a logical zero is driven on CTL[1]. If the transmitter does not support unganging, a logical one is driven on CTL[1]. In at least one embodiment, CTL[1:0] is required to be valid within a predetermined time period, e.g., 100 uS, of PWROK assertion. An associated receiver provides a detect signal (e.g., RXDCDETECT) when PWROK is asserted. Upon assertion of PWROK, compensation logic begins initialization and after a predetermined period (e.g., 300 uS), a first detect phase (e.g., DC Detect Phase 1) is executed to determine if the link is a DC link or an AC link, as in this embodiment only DC links support unganging. It should, however, be appreciated that it is contemplated that AC links may also be ganged or unganged according to variations of the techniques disclosed herein.

In the first detect phase, if a receiver supports unganging (e.g., as indicated by a hardwired connection), the receiver samples CTL[1] to determine if an upper byte of the link is a DC coupled link. The receiver then samples CTL[0] to determine to if a lower byte of the link is a DC coupled link, e.g., including differential pairs. A DC coupled link may be indicated by a static DC level. After the first detect phase, the transmitter drives the CLK signal, ramping to a predetermined frequency (e.g., 200 MHz).

Next, RESET# is deasserted and, assuming the link is a DC coupled link, a second detect phase (e.g., DC Detect Phase 2) is executed. The second detect phase determines if sublinks are to be ganged and if either of the two sublinks are inactive. In the second detect phase, if the receiver supports unganging and the CTL[1] signal is at a logical zero, the receiver samples CAD[8]. If CAD[8] is a logical zero, a link failure of the upper byte is indicated and the transmitter is configure to not drive signals on the upper byte sublink. The receiver then samples CAD[0] to determine if the lower byte sublink is active. If CAD[0] is a logical zero, a link failure of the lower byte is indicated and the transmitter is configured to not drive signals on the lower byte sublink. If CTL[1] indicates the link is ganged, then the upper sublink and the lower sublink are both set to inactive when a link failure associated with the lower byte sublink occurs. If CAD[8] and CAD[0] are a logical one, when the receiver is ready a general initialization of the upper and lower sublinks is initiated. Otherwise, if CAD[8] is a logical zero and CAD[0] is a logical one, when the receiver is ready a general initialization of the lower byte sublink is initiated.

During general initialization, a device-specific time after the deassertion of RESET#, each device asserts an associated CTL signal across a rising CLK edge, which initiates a synchronization sequence. The assertion of the CTL signal serves to indicate to the device at the other side of the link that the device is ready to initialize the link. The devices perform whatever device-specific functions (e.g., ramping internal clocks to full frequency, initializing receivers and reading configurations state from off-chip) are required between the time RESET# is deasserted and the time they assert CTL. If unganging is not supported by the receiver or CTL[1] is a logical one, the sublinks are configured as a single ganged link for training.

Following a cold reset, the PWROK signal is generally asserted a predetermined time period (e.g., about 1 mS) after power and clock sources for all device are stable. In general, RESET# is asserted a predetermined time period (e.g., about 1 mS) before PWROK is asserted and remains asserted for a predetermined time period (e.g., at least about 1 mS) beyond the assertion of PWROK. Typically, RESET# should remain asserted until the CLK signal from all transmitters is stable. In general, a cold reset initializes a link, in both directions, to a minimum width of both receivers and transmitters (up to 8 bits), enabling transactions to flow across the link. If an asymmetric width, or a width over 8 bits, is desired, software may be utilized to program the link width CSRs. In this case, a warm reset or link disconnect sequence may be required for the new values to take effect. In at least one embodiment, while RESET# is asserted during a cold reset, each device's transmitter drives a CLK signal on all implemented byte lanes, drives a CTL signal to a logical zero and drives all implemented CAD signals to a value that is based on a width of its receiver. For example, a CAD[31:0] value of: 0000 0003 may correspond to a 2-bit transmitter width; 0000 000F may correspond to a 4-bit transmitter width; 0000 00FF may correspond to a 8-bit transmitter width; 0000 FFFF may correspond to a 16-bit transmitter width; and FFFF FFFF may correspond to a 32-bit transmitter width.

The devices sample the CAD and CTL signals and the results are reflected in cold reset values of internal registers (e.g., a LinkWidthIn register and a LinkWidthOut register) that maintain a transmitter width and a receiver width of a device. If all CAD inputs are logical zero, an unused link is indicated and an end-of-chain bit in a link control register is set. If the upstream and downstream widths of a link are different, then at cold reset, the widths are initialized to the smaller of the two widths, up to 8 bits. In this case, software may be utilized to reprogram the link to use the maximum upstream and downstream width possible, following enumeration.

Figure 5:
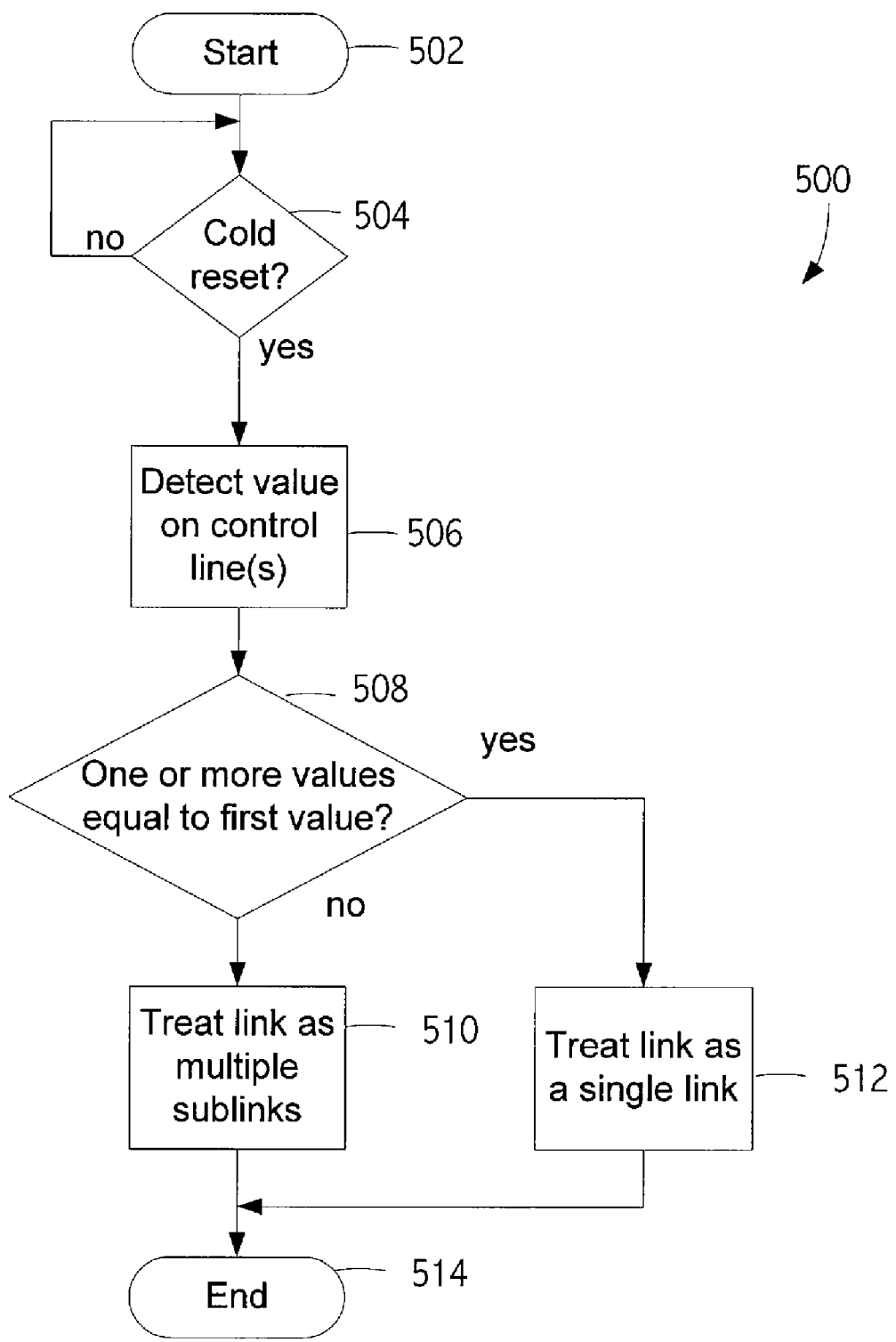
FIG. 5 is an exemplary flow diagram of a process for negotiating a width (ganging and unganging) of a packet-based communication link.

With reference to FIG. 5, an exemplary gang/ungang process 500 for determining whether to configure a link as a single link or as a plurality of unganged sublinks is depicted. At block 502, the process 500 is initiated and control transfers to decision block 504. In block 504, the process 500 determines whether a cold reset has occurred. If so, control transfers to block 506 where a value on an appropriate control line is detected. For example, if the link is a 16-bit DC coupled link a signal driven on CTL[1] is detected. As another example, if the link is a 32-bit DC coupled link, signals driven on CTL[1], CTL[2] and CTL[3] are detected to determine how the 32-bit link is to be configured. When the value(s) of the signal(s) is/are a first value, e.g., a logical one, control transfers to block 512, where the link is configured as a single link by, for example, setting an appropriate bit in a register. Otherwise, control transfers from block 508 to block 510, when the value(s) is/are a second value, e.g., a logical zero. In block 510, the link is configured as multiple sublinks by, for example, clearing an appropriate bit in a register. Following blocks 510 and 512 control transfers to block 514 where the process 500 terminates.

Accordingly, a technique has been described herein that allows devices associated with a link to negotiate whether a link is configured as a ganged link or as a plurality of unganged sublinks through respective signals driven on one or more control lines. This technique is particularly advantageous in allowing the implementation of different topologies with a computer architecture. For example, three processors having 32-bit links may be fully connected by unganging the 32-bit links into two 16-bit links.

What is claimed is:

1. A method for configuring a point to point communication link connecting a first device and a second device, the communication link including data lines and a plurality of control lines respectively associated with respective subsets of the data lines, the method comprising:
 configuring the point to point communication link as a single link having a width of N or as multiple sublinks, each of the sublinks having a width less than N, based on a value of one or more of the control lines that form part of the communication link, wherein a combined width of the multiple sublinks is equal to N, where N is an integer value;
 wherein each sublink includes one or more of the subsets of the data lines and one of the control lines.

2. The method of claim 1, wherein N is equal to sixteen or thirty-two.

3. The method of claim 2, wherein the multiple sublinks include at least two eight-bit sublinks.

4. The method of claim 1, wherein the communication link includes a single unidirectional connection from the first device to the second device.

5. The method as recited in claim 1 wherein all of the sublinks are of equal width.

6. The method as recited in claim 1 wherein at least two of the sublinks are of different widths.

7. The method as recited in claim 1 wherein the control lines distinguish between types of data packets on the data lines.

8. A system, comprising:
- a first device;
- a second device; and
- a communication link coupling the first and second devices, the communication link including a plurality of control lines and a plurality of data lines, each of the control lines associated with a respective subset of the data lines, wherein, during initialization, a value of one or more of the control lines determines whether the communication link is configured as a single link having a width of N or as multiple sublinks each having a width less than N and each sublink including one or more of the subsets of the data lines and one of the control lines, and wherein a combined width of the sublinks is N, where N is an integer.

9. The system of claim 8, wherein N is equal to sixteen or thirty-two.

10. The system as recited in claim 8 wherein all of the sublinks are of equal width.

11. The system as recited in claim 8 wherein at least two of the sublinks are of different widths.

12. A method comprising:
- setting one or more control lines of a communication link to a first value to indicate that a transmitter of a device supports operating the communication link as a single link having a width of N; and
- setting the one or more control lines to a second value to indicate that the transmitter of the device supports operating the communication link as multiple sublinks, each of the sublinks having a width less than N, and wherein a combined width of the sublinks is equal to N, N being an integer;
- wherein each of the control lines is associated with respective subsets of data lines on the communication link.

* * * * *